United States Patent

Rostoker et al.

[11] Patent Number: 5,888,847
[45] Date of Patent: Mar. 30, 1999

[54] TECHNIQUE FOR MOUNTING A SEMICONDUCTOR DIE

[75] Inventors: Michael D. Rostoker, Boulder Creek; Mark R. Schneider, San Jose, both of Calif.

[73] Assignee: LSI Logic Corporation, Milpitas, Calif.

[21] Appl. No.: 569,501

[22] Filed: Dec. 8, 1995

[51] Int. Cl.[6] .......................... H01L 21/58; H01L 21/603; H01L 21/607

[52] U.S. Cl. .......................... 438/108; 438/109; 438/120; 438/612; 438/688

[58] Field of Search .................................. 438/108, 109, 438/120, 612, 688

[56] References Cited

U.S. PATENT DOCUMENTS

| | | |
|---|---|---|
| 3,793,714 | 2/1974 | Bylander . |
| 3,956,821 | 5/1976 | Martin . |
| 5,620,928 | 4/1997 | Lee et al. . |
| 5,642,055 | 6/1997 | Difrancesco . |
| 5,660,319 | 8/1997 | Falcone et al. . |
| 5,665,473 | 9/1997 | Okoshi et al. . |

FOREIGN PATENT DOCUMENTS

| | | |
|---|---|---|
| 58-095849 | 6/1983 | Japan . |
| 63-122135 | 5/1988 | Japan . |
| 4-062864 | 2/1992 | Japan . |

Primary Examiner—David Graybill

[57] ABSTRACT

A semiconductor die is mounted to a die receiving area, which is defined by inner ends of conductive leads to which the die is connected. The die is temporarily retained in a substantially fixed position relative to the die receiving area by various techniques for the purpose of permitting bond wires to be attached between the conductive leads and the die. Preferred techniques include employing a mechanical chuck, dispensing an adhesive between the die and its die receiving area, and forming an ultrasonic bond between the die and the die receiving area. Once electrical connections between the die and the conductive lines are formed, the die need not be retained in a fixed position, as the electrical connections will provide sufficient support for the die. Accordingly, conventional die attach techniques, which expose the semiconductor die to substantially elevated temperatures, are avoided. Further, dies so mounted, which are not firmly anchored in accordance with conventional the attach techniques, are not subjected to mechanical stresses resulting from a difference in die thermal expansion between the die and its die receiving area.

14 Claims, 3 Drawing Sheets

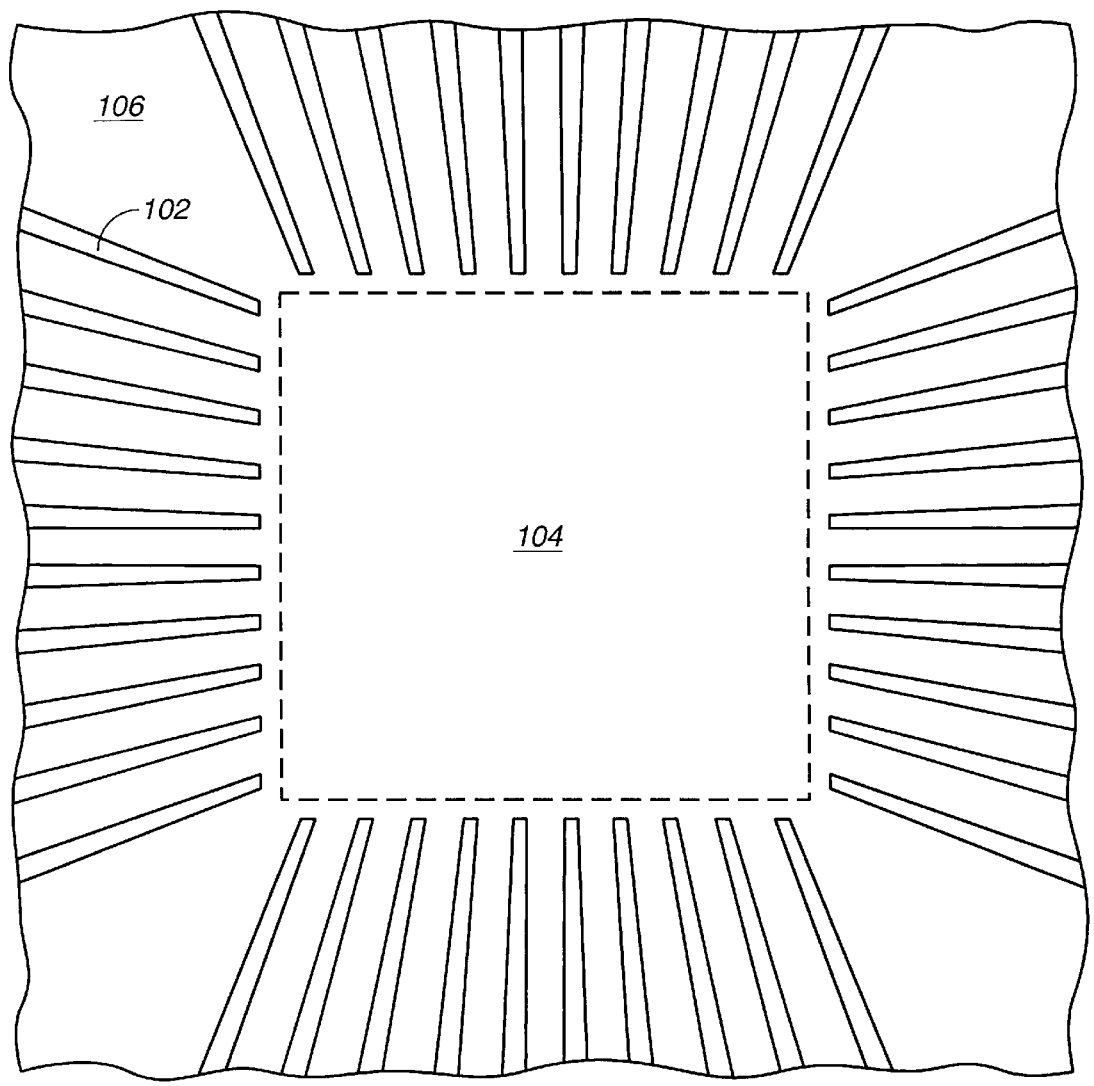
FIG._1

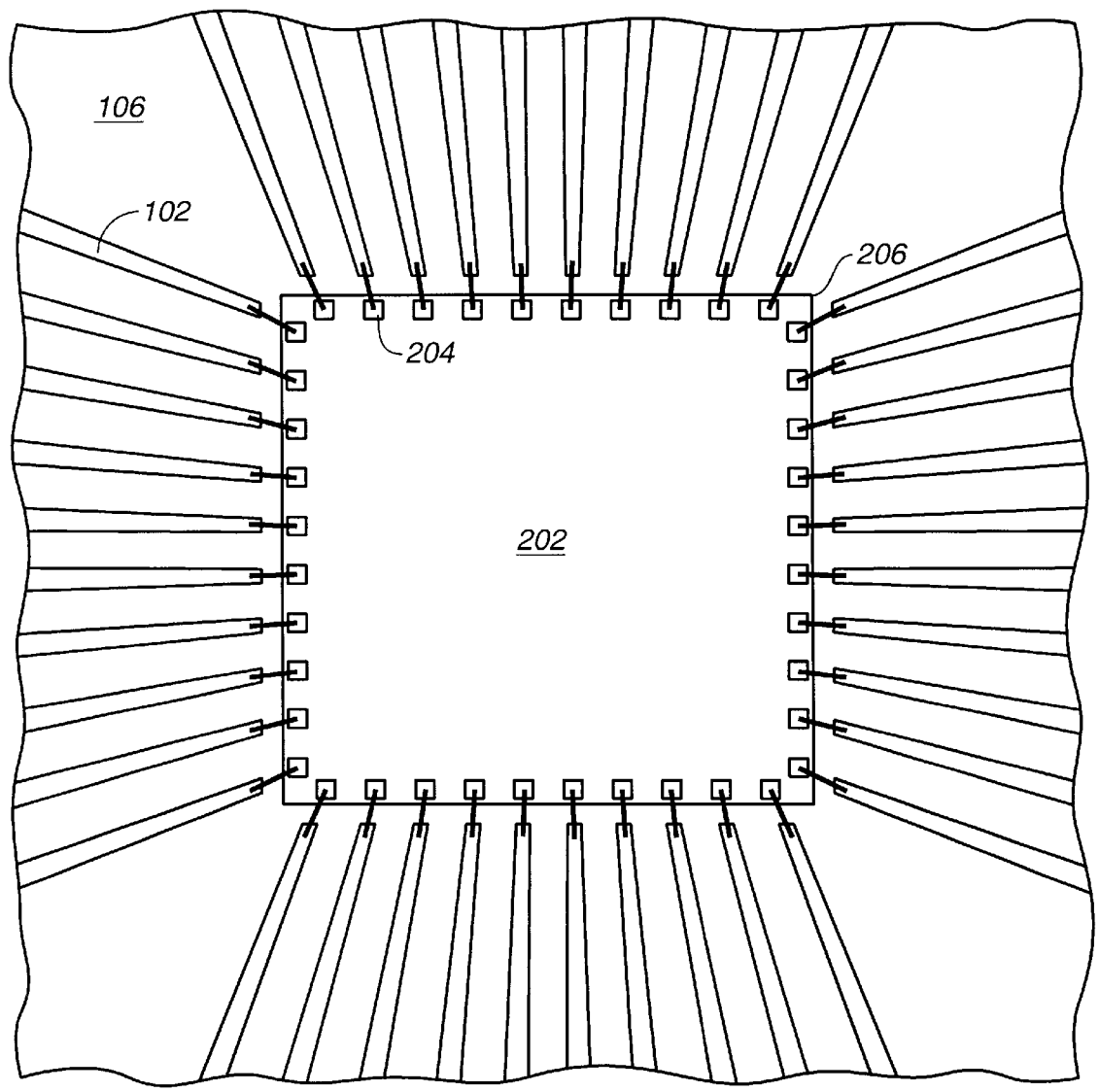
FIG._2

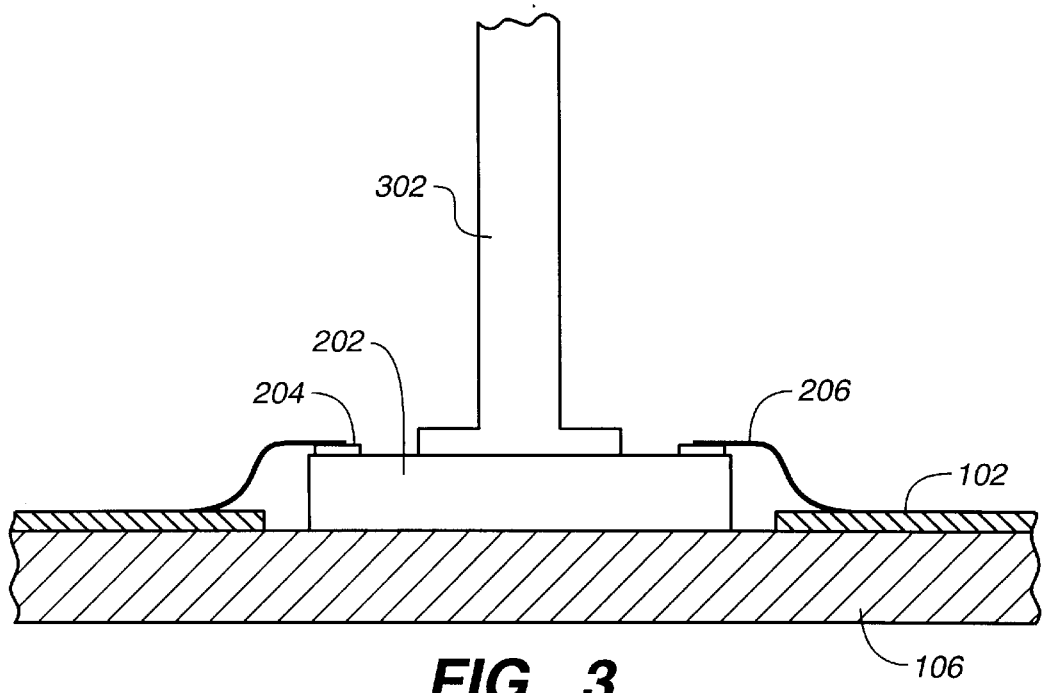
FIG._3
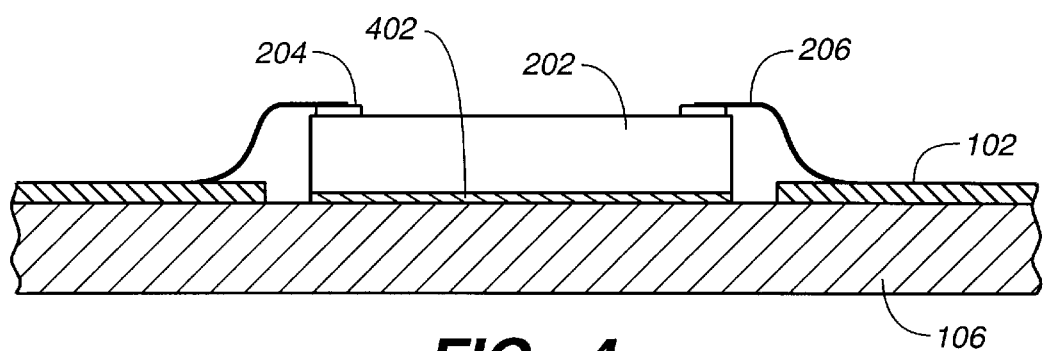
FIG._4
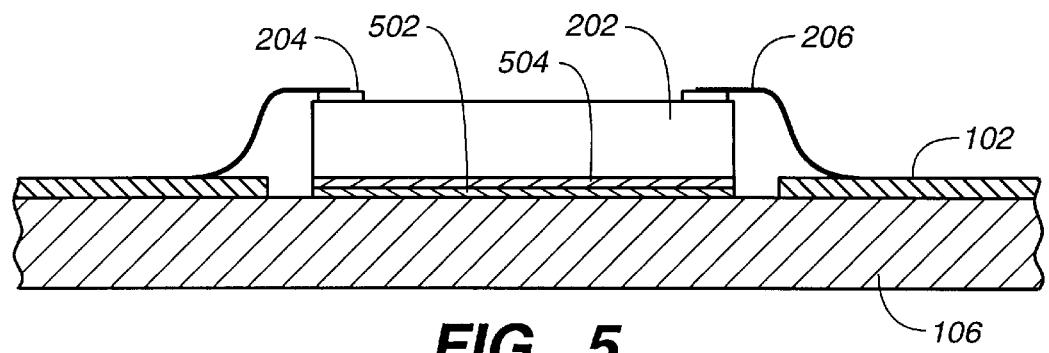
FIG._5

TECHNIQUE FOR MOUNTING A SEMICONDUCTOR DIE

FIELD OF THE INVENTION

The present invention relates to a method for manufacturing semiconductor devices, and more particularly, for mounting a semiconductor die in a semiconductor package.

BACKGROUND OF THE INVENTION

Typically, a large number of integrated circuits are formed on a silicon wafer. The silicon wafer is then sliced into individual "semiconductor dies" (also referred to as "semiconductor chips") which are then packaged for use.

A "semiconductor device package" typically includes a semiconductor die having a number of bond pads for the purpose of making electrical connections to the integrated circuitry of the die, and is mounted such that the bond pads are exposed. Bond pads, which provide input/output ("I/O") connections to a die, are typically placed along the edges of the die. Inner ends of conductive lines (also referred to as conductive traces, bond fingers, lead fingers or leads) are disposed around the periphery of the die such that they form an array of connection points surrounding the die. A die is typically mounted or attached in a die-receiving area of the semiconductor device package, that is, the area defined by the inner ends of the conductive lines.

Once the semiconductor die is attached, bond pads of a semiconductor die are connected to the connection points provided by the inner ends of conductive lines in one of several ways. Very thin bond wires, usually formed of aluminum or gold, are often used to connect the connections points on a one-for-one basis with the bond pads on the semiconductor die. Tape-automated and solder bump bonding techniques have been employed to connect to the semiconductor die.

Conductive lines extend outward from the die-receiving area, ultimately ending at the external pins of the semiconductor device package, for interfacing with external circuitry and providing electrical connection therewith. The semiconductor device package may be mounted in a socket on a circuit board, typically with additional components.

In the past, dies have been anchored to die receiving areas in an effort to preclude any movement of the die. This is to prevent the die from moving while forming connections between the die and the connection points of the conductive lines. Various die attach techniques have been used. Typical techniques involve interposing an adhesive substance between a die and the die receiving area. In some instances, other die attach materials have been used which were heated in order to form a bond between the die and the die receiving area. Conventional eutectic die attach techniques deposit a layer of gold on the back of a die and mount the die over a layer of gold-silicon provided in the die receiving area. Such techniques provide a bond formed between the die and the die receiving area when exposed to elevated temperatures above 425° C. Other conventional die attach techniques have employed polymers (such as epoxy materials), glass, silver filled glass, and solders, as die attach materials. Placement of the die attach material and its subsequent heating have been burdensome and laborious tasks. Conventional die attach techniques require a manufacturer to incur the cost of die attach materials, such as gold and silver filled glass, which adds to the manufacturing costs. As a result, conventional die attach techniques have been relatively expensive.

One drawback of conventional die attach techniques has been the requirement of heating a die attach material to cure it, because this step in the process also exposes the semiconductor die to elevated temperatures. Ever decreasing geometries of circuit elements are available on a die. In the past, elevated temperatures have caused those circuit elements to fuse together, rendering the die inoperable. Moreover, the structural integrity of the die itself may be compromised by the thermal stresses applied to the die when the die is exposed to elevated temperatures.

Anchoring a die to a die receiving area poses several problems. Heat is inevitably generated during operation of circuitry on a die. The problem of heat dissipation is especially relevant in semiconductor dies that have a high lead count (e.g., high I/O) or which operate at high speeds, both of which may contribute significantly to the generation of heat by the die. Efforts to deal with heat have included the addition of heat sinks bonded to the die. Semiconductor dies generally expand when heated. The rate of expansion is usually a different rate than the expansion of any of a heatsink or other structure to which the die is bonded. At elevated temperatures (or at temperatures significantly different from the temperature at which the die was attached), such differential rates of expansion can cause mechanical stresses which can crack the die (which is relatively brittle), resulting in complete failure of the die.

Conventional semiconductor die attachment techniques have not been altogether satisfactory, and leave room for significant improvement. A technique for mounting semiconductor dies is needed that overcomes the shortcomings of conventional die attachment techniques.

SUMMARY OF THE INVENTION

It is an object of the present invention to provide a method for mounting semiconductor dies without having the dies firmly anchored to their die receiving area, without exposing semiconductor dies to substantially elevated temperatures, in a facile and inexpensive manner. It is also an object of the present invention to provide a product manufactured by such a method.

According to the present invention, a semiconductor die is initially mounted by placing it in a die receiving area. Bond pads on the die are preferably the inner ends of corresponding conductive leads that surround the periphery of the die. The die is temporarily retained in a substantially fixed position relative to the die receiving area during the formation of electrical connections, such as wire bonds, between the inner ends of the conductive lines and the die. Preferably, metal such as aluminum is deposited on the bottom of the die, and on the package in the die receiving area. The metal bottom of the die is brought into contact with the metal surface in the die receiving area. A temporary bond is established by ultrasonically scrubbing the metal surfaces together. Once electrical connections are made by attaching wire bonds, a die mounted in accordance with the present invention is adequately supported by the wire bonds. No die attach material is used and high temperature curing is avoided. Thus, conventional die attach techniques are avoided. It is not necessary to anchor the die to its die receiving area.

The benefits derived from the present invention are significant. Laborious and expensive conventional die attach techniques, which expose the semiconductor die to substantially elevated temperatures, are avoided. In addition, dies mounted in accordance with the present invention are not firmly anchored to the die receiving area, and therefore are not subjected to mechanical stresses resulting from a difference in the thermal expansion between tie die and its die receiving area.

Various techniques can be employed to retain the die in a fixed position during the formation of electrical connections to the die. At least three alternative embodiments are disclosed as examples of the invention, although the described examples are not intended to be exclusive. First, a mechanical chuck can be used to temporarily attach and hold the die in a fixed position until the necessary electrical connections are made to the die. Second, an adhesive may be dispensed over the die receiving area such that a temporary adhesive bond sufficient to hold the die in a fixed position long enough to allow electrical connection to be made by attaching bond wires. Third, an ultrasonic bond may be formed between the die and the die receiving area as described above. This is accomplished by depositing an ultrasonic-scrub-bondable layer both on the bottom side of the die and upon the die receiving area, and then ultrasonically scrubbing the layers against one another to form a temporary bond. Both the adhesive bond and ultrasonic bond at least temporarily retain the die in a fixed position for the limited purpose of connecting the die to the inner ends of conductive lines.

Other and further objects, features and advantages will be apparent from the disclosure of certain embodiments of the present invention set forth below.

BRIEF DESCRIPTION OF THE DRAWINGS

The present invention may be better understood from the following detailed description of example embodiments of the invention with reference to the accompanying drawings, in which:

FIG. 1 is a top view of a cut away drawing of a die receiving area.

FIG. 2 is a top view of a semiconductor die disposed in the die receiving area shown in FIG. 1, with electrical connections formed by connecting bond wires between the package and the die.

FIG. 3 is a cross-sectional view of a semiconductor die in a die receiving area and a mechanical chuck in contact with the die.

FIG. 4 is a cross-sectional view of a semiconductor die in a die receiving area temporarily held in position by an adhesive.

FIG. 5 is a cross-sectional view of a semiconductor die in a die receiving area with metal layers bonded by ultrasonic scrubbing.

DETAILED DESCRIPTION OF A PREFERRED EMBODIMENT OF THE PRESENT INVENTION

FIG. 1 is a top view of a die receiving area 104. An array of conductive lines 102 (also referred to as conductive traces, bond fingers, lead fingers or leads) fan inwardly and define the "die receiving area" 104. Conductive lines 102 extend outwardly from the die receiving area 104 for connection to external connection elements (not illustrated). A planar substrate 106 is provided beneath the conductive lines 102. While the present invention is described in connection with the substrate 106 having conductive lines 102 and a die receiving area 104, shown in FIG. 1, the present invention may be equally applicable to a lead frame assembly.

FIG. 2 is a top view of a semiconductor die 202 disposed in the die receiving area 104 with electrical connections formed to the die 202, in accordance with one embodiment of the present invention. The semiconductor die 202 includes bond pads 204 that are preferably placed along the periphery of die 202, and which provide the input and output connections to the circuitry on die 202. Bond wires 206 are used to form electrical connections between the bond pads 204 and the inner ends of conductive lines 102. The bond wires 206 are simultaneously (a) support members for holding the die 202 in position in a packaged semiconductor device package, and (b) conductive members for providing electrical connection between the circuitry on the die 202 and the pins of the semiconductor device package.

In accordance with the present invention, the semiconductor die 202 is not permanently anchored to the die receiving area 104 using conventional die attach techniques. Rather, the semiconductor die 202 is temporarily maintained in a fixed position relative to the die receiving area 104 during the formation of electrically conductive support members 206 between the die 202 and the conductive lines 102. In contrast to conventional die attach techniques, maintaining the die 202 in a fixed position relative to the die receiving area 104 (long enough to permit bond wires 206 to be connected) is accomplished without the requirement of curing the die attach material at substantially elevated temperatures. This avoids compromising the structural integrity of the die, which is becoming more of a problem as dies having increasingly smaller geometries are developed.

Once electrical connections are formed between die 202 and conductive lines 102, the semiconductor die 202 is maintained in position relative to its die receiving area 104 by the electrical connections to the die 202. In accordance with the present invention, bond wires 206 are sufficient, in and of themselves, to ensure that the die 202 remains in position relative to die receiving area 104. This is especially true of "high I/O" dies that require a relatively large number of bond wires 206. By not firmly anchoring the die 202 to the die receiving area 104, several advantages are gained. For example, any difference between the rates of thermal expansion between the die 202 and the die receiving area 104 when the die 202 becomes heated during operation will not result in the application of significant mechanical stresses to die 202.

The die 202 can be maintained in a temporary fixed position relative to its die receiving area 104 long enough to permit bond wires 206 to be attached by numerous techniques. FIGS. 3–5 illustrate examples of alternative techniques of maintaining die 202 in a temporary fixed position. However, other techniques, and modifications of the preferred techniques, will readily suggest themselves to those of skill in the art after having the benefit of the present disclosure.

FIG. 3 is a cross sectional view of a semiconductor die temporarily maintained in a fixed position relative to the die receiving area 104 by employing a mechanical chuck 302. A mechanical chuck 202 may include an attachment that is operable to hold a work piece, such as semiconductor die 202, in a selected position. The mechanical chuck 302 retains the semiconductor die 202 in a fixed position relative to the die receiving area 104 prior to, and during, the formation of electrical connections 206 between the die 202 and the conductive lines 102. The chuck 302 preferably operates by applying a negative pressure or a magnetic field to the die 202. Other techniques known in the art may also be employed. The chuck 302 may be applied to die face of the die 202. However, the chuck 302 can be applied to other portions of the die 202, including the back side of the die 202 when a portion of the back side of the die 202 is exposed through the die receiving area 104. After electrical connections 206 a re formed between the bond pads of die 202 and the inner ends of conductive lines 102, the chuck 302 may be removed.

FIG. 4 is a cross-sectional view of a semiconductor die 202 which is temporarily held in a fixed position relative to the die receiving area 104 by an adhesive 402. A layer of adhesive 402 is preferably dispensed over the die receiving area 104. The die 202 is then disposed above the adhesive 402 in order to effect an adhesive bond between the die 202 and the die receiving area 104. The adhesive 402 is selected to temporarily fix the position of the die 202 relative to the die receiving area 104 without the need to expose the die 202 to substantially elevated temperatures. The adhesive 402 should preferably exhibit strong adhesive properties, and may include, for example, 3300 die material, a sine-aerolate, and glue. Adhesive 402 need only cause the die 202 to adhere to the die receiving area 104 during the formation of electrical connections 204. Thereafter, the adhesive 402 may degrade overtime. Thus, a degradable adhesive 402 that does not require high temperature curing may be used, because only a temporary bond is required.

FIG. 5 shows a cross-sectional view of a semiconductor die 202 temporarily fixed relative to the die receiving area 104 by ultrasonic scrubbing. A layer of ultrasonically bondable material 502 is preferably deposited over the back side of the die 202, that is, the side of the die 202 opposite the bond pads 204. A layer of ultrasonically bondable material 504 is preferably also deposited over the die receiving area 104. The ultrasonically bondable material 502 and 504 is preferably a conductive layer 502 and 504 respectively. The conductive material 502 and 504 is preferably aluminum. By ultrasonically scrubbing layer 502 against layer 504, the exposed surfaces of layers 502 and 504 are temporarily bonded prior to the formation of electrical connections 206. In this example, bonding by ultrasonic scrubbing is relied on to maintain the die 202 in a fixed position relative to the die receiving area 104 until bond wires 206 can be connected between the bond pads 204 and the inner ends of conductive lines 102. Whether the ultrasonic bond remains intact or is broken (possibly by the application of thermal and mechanical stresses to the bond during the operation of die 202) following the establishment of electrical connections 206 is immaterial since the bond need only be temporary and is established for the sole purpose of maintaining the position of the die 202 while forming electrical connections 206 by attaching bond wires 206.

"Ultrasonically bondable material" as used herein means a material that will at least temporarily form a bond between two surfaces when the two surfaces are frictionally engaged into contact with each other and rubbed back and forth relative to each other at an ultrasonic rate or frequency.

The present invention, therefore, is well adapted to carry out the objects and attain the ends and advantages mentioned, as well as others inherent therein. While presently preferred embodiments of the invention have been given for the purposes of disclosure, alternative embodiments, changes and modifications in the details of construction, interconnection and arrangement of parts will readily suggest themselves to those skilled in the art after having the benefit of this disclosure. For example, although a package member 106 is illustrated which utilizes a single die 202, the present invention may be used in connection with multi-chip modules and flip chip devices. This invention is not necessarily limited to the specific examples illustrated and described herein. All such alternative embodiments, changes and modifications encompassed within the spirit of the invention are included, and the scope of the invention is defined by a proper construction of the appended claims.

What is claimed is:

1. A method of making a package integrated circuit component, comprising:
   providing a package member having a semiconductor die receiving area, the die receiving area including leads coupled to pins said leads being capable of conducting electricity between said pins and said die receiving area;
   depositing a layer of ultrasonically bondable material on a first surface of the die receiving area;
   depositing a layer of ultrasonically bondable material on a second surface of a semiconductor die, the semiconductor die having semiconductor circuits formed thereon;
   ultrasonically scrubbing the second surface of the die with the first surface of the die receiving area; and
   forming support members between the semiconductor die and the leads to hold the die in position, said support members capable of holding the die in position without additional support, said support members further capable of conducting electricity to provide connections capable of conducting electricity between said circuits and said pins.

2. The method according to claim 1,
   the ultrasonically bondable material deposited on the first surface of the die receiving area is a first layer, said first layer being capable of conducting electricity.

3. The method according to claim 2, wherein:
   the ultrasonically bondable material deposited on the second surface of the semiconductor die is a second layer, said second layer being capable of conducting electricity.

4. The method according to claim 3, wherein:
   the first and the second layers comprise aluminum.

5. A method of mounting a semiconductor die in a package, comprising:
   making a die receiving area in a package member for a semiconductor die, the package member having leads, said leads capable of conducting electricity and adapted to provide electrical connections between the semiconductor die and external pins of a semiconductor device package;
   retaining a semiconductor die in a substantially fixed position relative to the die receiving area until electrical connections are established between the semiconductor die and the leads without exposing the semiconductor die to substantially elevated die attachment material curing temperatures; and
   forming support members between the semiconductor die and the leads, said support members capable alone of maintaining the semiconductor die in a substantially fixed position relative to the die receiving area, said support members further being capable of conducting electricity to provide connections capable of conducting electricity between the semiconductor die and the leads.

6. The method according to claim 5, wherein:
   the step of temporarily retaining the semiconductor die in a substantially fixed position relative to the die receiving area comprises holding the semiconductor die with a mechanical chuck.

7. The method according to claim 5, wherein:
   the step of retaining the semiconductor die in a substantially fixed position relative to the die receiving area comprises forming an adhesive bond between the semiconductor die and the die receiving area.

8. The method according to claim 5, wherein:

the step of retaining the semiconductor die in a substantially fixed position relative to the die receiving area comprises ultrasonically scrubbing a surface of the semiconductor die with a surface of the die receiving area.

9. The method according to claim 1, wherein:

the semiconductor die receiving area is a plurality of semiconductor die receiving areas and the semiconductor die is a plurality of semiconductor dice.

10. The method according to claim 1, wherein:

the method of ultrasonically scrubbing thermosonic welding.

11. The method according to claim 1, wherein:

the conductive support members are tape automated bonding (TAB) leadframe fingers.

12. The method according to claim 1, wherein:

the support members are bond wires.

13. The method according to claim 3, wherein:

the first and second conductive layers are comprised of gold.

14. The method according to claim 5, wherein:

the semiconductor die receiving area is a plurality of semiconductor die receiving areas and the semiconductor die is a plurality of semiconductor dice.

\* \* \* \* \*